United States Patent [19]

Matsumoto et al.

[11] Patent Number: 5,010,493

[45] Date of Patent: Apr. 23, 1991

[54] LOAD DISTRIBUTION METHOD

[75] Inventors: Kenji Matsumoto, Aiko; Tomoatsu Yanagita, Ebina; Yoshinori Nishiyama, Odawara; Masahiko Nagai, Naka; Mitsuru Morikuni, Ebina, all of Japan

[73] Assignees: Hitachi, Ltd., Tokyo; Hitachi Computer Engineering Co., Ltd., Kanagawa, both of Japan

[21] Appl. No.: 343,362

[22] Filed: Apr. 26, 1989

[30] Foreign Application Priority Data

Apr. 26, 1988 [JP] Japan ................................. 63-103553

[51] Int. Cl.$^5$ ............................................. G06F 15/60
[52] U.S. Cl. ...................................... 364/490; 364/488
[58] Field of Search ............... 364/490, 491, 489, 488, 364/300; 307/154, 155, 407, 409, 296.1

[56] References Cited

U.S. PATENT DOCUMENTS

| T935,003 | 6/1975 | Linville et al. | 364/490 |
| 4,593,362 | 6/1986 | Bergeron et al. | 364/488 |
| 4,636,965 | 1/1987 | Smith et al. | 364/491 |
| 4,636,966 | 1/1987 | Yamada et al. | 364/300 |
| 4,698,760 | 10/1987 | Lembach et al. | 364/490 |
| 4,839,821 | 6/1989 | Murakata | 364/488 |
| 4,910,680 | 3/1990 | Hiwatashi | 364/489 |

Primary Examiner—Parshotam S. Lall
Assistant Examiner—Ellis B. Ramirez
Attorney, Agent, or Firm—Antonelli, Terry, Stout & Kraus

[57] ABSTRACT

A load distribution method in which loads are divided into groups and each of a plurality of input pins of integrated circuits of a load is wired continuously with one stroke of a signal transmission line in a sequence from a driving output pin in each group when the wiring for distributing the drive signal from the driving output pin of an integrated circuit to plural input pins of integrated circuits, functioning as a load, is such that a plurality of intergrated circuits are mounted at given positions on a printed circuit board. In the load distribution method, the load is divided into groups by equally distributing a number of the loads so as to allow load capacities to be equal to each other on each of a plurality of signal transmission lines, and there is computed a signal propagation delay time of the signal transmission line wired equally in a distance to a load which is equal in a wiring sequence from the driving output pin in each group. Also, the loads are grouped by determining a combination of loads in which the signal propagation delay time of the signal transmission line becomes the shortest.

10 Claims, 8 Drawing Sheets

FIG.3a

| | |
|---|---|
| DELAY TIME PER UNIT DISTANCE OF WIRING MATERIAL | $T_1$ |
| RATIO OF DELAY TIME TO LOAD CAPACITY | $T_2$ |
| TOLERANCE SIGNAL PROPAGATION DELAY TIME | $T_3$ |

| NAME OF PIN | PIN x-COORDINATE | PIN y-COORDINATE | LOAD CAPACITY |
|---|---|---|---|
| OUTPUT PIN | x1 | y1 | — |
| LOAD 1 | x2 | y1 | C |
| LOAD 2 | x3 | y1 | C |
| LOAD 3 | x2 | y2 | C |
| LOAD 4 | x3 | y2 | C |

LOAD DISTRIBUTION METHOD

BACKGROUND OF THE INVENTION

The present invention relates to a load distribution method for distributing a drive signal into each of a plurality of loads using a plurality of independent signal transmission lines on a printed circuit board. More particularly, the present invention relates to a load distribution system in which loads are divided into groups and a driving output pin is wired continuously to an input pin of each of the loads in every group with one stroke of each of a plurality of transmission lines in an order or sequence from the driving output pin, particularly when plural integrated circuits are mounted at predetermined positions on the printed circuit board and the wiring is effected for distributing the drive signal from the driving output pin to the plural input pins of loads in the integrated circuits.

When plural large scale integrated circuits (LSIs) are mounted and subjected to load drive wiring therebetween, the load drive wiring for an electronic device with the LSIs designed layerwise is effected in such a manner that loads are divided into some groups to provide independent signal transmission lines and a drive signal is supplied through the independent signal transmission lines. The advantage of this wiring resides in the fact that the signal transmission lines can be shortened, as disclosed, for example, in Japanese Laid-Open Patent Application (kokai) No. 58-213,448/1983. The method of grouping loads for the wiring in the manner as described hereinabove includes techniques of shortening distances of all the signal transmission lines to minimum lengths, minimizing the difference of capacities on each signal transmission lines by equalizing the number of loads, and the like.

However, the method of grouping the loads for the wiring in the manner described hereinabove merely considers individually a distance of the signal transmission lines, equalization of the number of loads, or the like. Accordingly, in a particular group of loads, a delay time may become too long or a load may not be driven due to an electric influence.

SUMMARY OF THE INVENTION

Therefore, an object of the present invention is to provide a load distribution method in which loads are divided into groups in accordance with conditions of grouping loads to satisfy an electric restraint of signal transmission lines and a restraint of signal transmission below a tolerance signal propagation delay time and in which the loads in the resulting group are further grouped so as to shorten the signal propagation delay time of the signal transmission lines to a minimum length.

In order to achieve the above object, the load distribution method according to the present invention comprises dividing loads into groups and wiring all the plural signal transmission lines continuously with one stroke in an order or sequence from a driving output pin to each of input pins of loads in every group when the drive signal is distributed from the driving output pin of an integrated circuit into the input pins of loads of the plural integrated circuits which are mounted at predetermined positions on a printed circuit board. The load distribution method is characterized in that the number of the loads is equally divided into groups so as to equalize a load capacity on each of the signal transmission lines, a signal propagation delay time is computed for the signal transmission lines in which distances to loads which are equal in the wiring order from the driving output pin in every group are equally wired, and a combination of the loads is determined so as to minimize the signal propagation delay times of the signal transmission lines to the shortest.

More specifically, when the loads of plural integrated circuits are mounted at predetermined positions on the printed circuit board and the drive signal from the driving output pin of the integrated circuit is supplied to the loads by the plural signal transmission lines is supplied to the loads, the loads are first divided into groups by equally distributing the number of loads so as to equalize the load capacity of each of the plural signal transmission lines.

Then a signal propagation delay time is computed for a signal transmission line in which distances to loads which are equal in the wiring order from the driving output pin in every group are equally wired.

Thereafter, a combination of the loads is determined so as to shorten the signal propagation delay times of the signal transmission lines to a minimum length by altering a combination of loads in every group and computing the signal propagration delay time of the signal transmission line in every group.

As a result of determination, the loads are grouped in a combination in which the signal propagation delay time of the signal transmission line becomes the shortest and the plural loads grouped are wired to each other to supply a drive signal by another signal transmission line.

The grouping of the loads is accordingly effected so as to satisfy an electric restraint of the load driving in the plural signal transmission lines and to effect the wiring with the signal transmission line propagating a driving signal in a minimum signal propagation delay time.

BRIEF DESCRIPTION OF THE DRAWINGS

The other objects, features and advantages of the present invention will become apparent in the course of the description of the preferred embodiments which follows, with reference to the accompanying drawings, in which:

FIG. 3a is a view showing one example of a design base data table for printed circuit board design data stored in an external storage unit;

FIG. 3b is a view showing one example of a pin data table for printed circuit board design data stored in the external storage unit;

DESCRIPTION OF THE PREFERRED EMBODIMENTS

Figure 1:
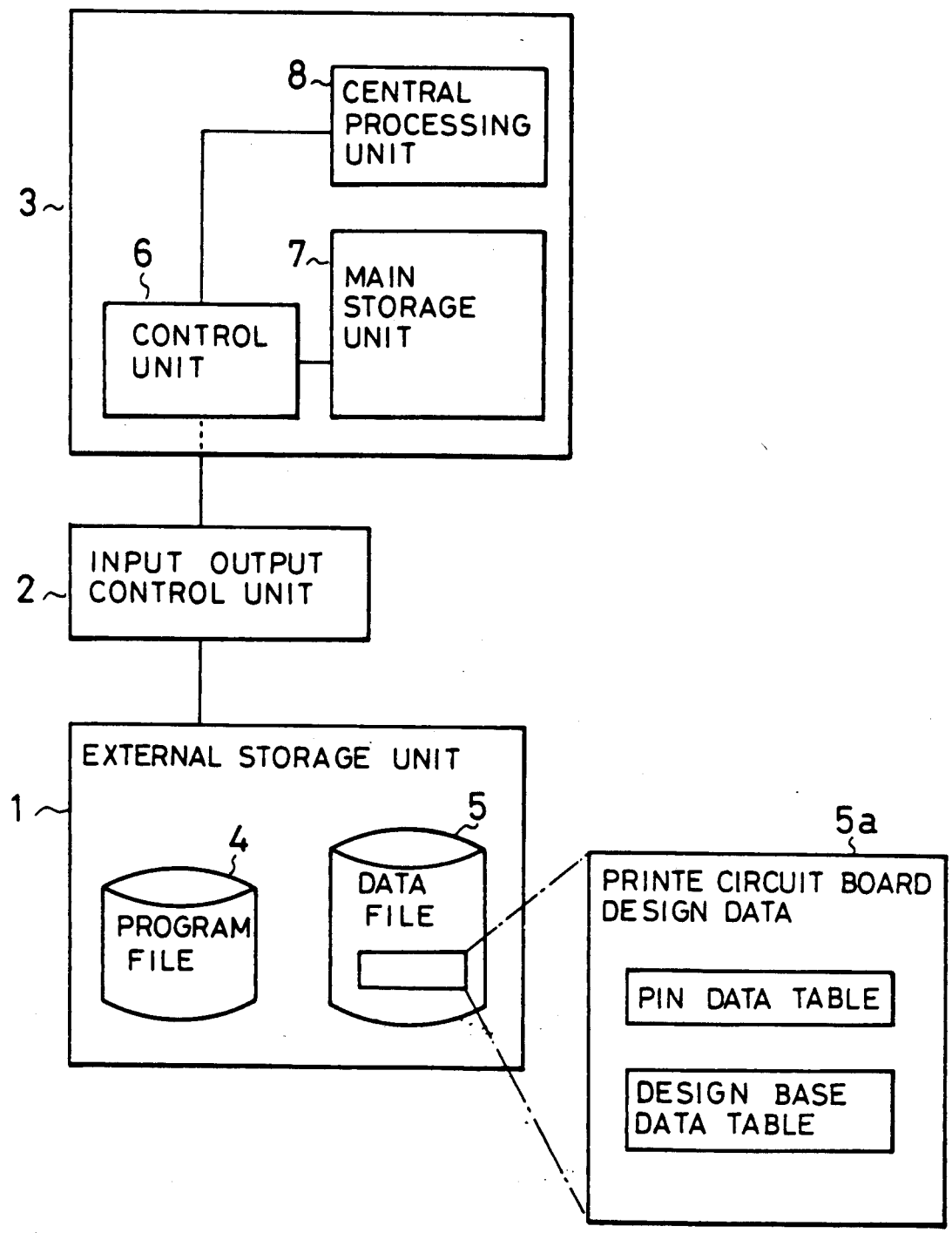
FIG. 1 is a block diagram of a system configuration for practicing one embodiment of the load distribution method according to the present invention.

In a block diagram of FIG. 1 showing a system configuration for practicing one preferred embodiment of the load distribution method according to the present invention, reference numeral 1 stands for an external storage unit, 2 for an input/output control unit, 3 for a computer main frame, 4 for a program file as a set of processing programs for implementing load distribution processing, 5 for a data file for implementing the processing programs, 5a for a printed circuit board design data, 6 for a control unit of the computer main frame, 7 for a main storage unit of the computer main frame, and 8 for a central processing unit (CPU) of the computer main frame.

The external storage unit 1 may be, for example, a magnetic disc unit for storing the program file 4 and the data file 5, and the input/output control unit 2 is a unit for controlling an input and an output between the external storage unit 1 and the computer main frame 3. The computer main frame 3 comprises the control unit 6, the main storage unit 7 and the central processing unit 8, and is designed to read necessary data such as the processing program of the program file 4 and the pin data table, the design base data table and the like of the printed circuit board design data 5a in the data file 5, to store the data, the processing programs and the like in the main storage unit 7, and to execute the processing programs for processing the load distribution by the central processing unit 8. The control unit 6 is to control the central processing unit 8 and the main storage unit 7.

Figure 2:
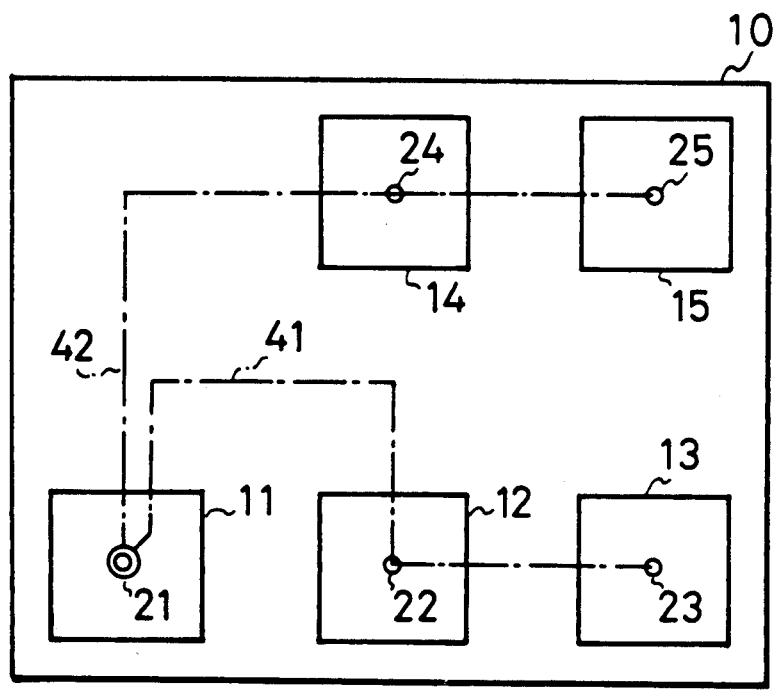
FIG. 2 is a view showing one example of a printed circuit board as an object of processing to be executed by the load distribution method according to the present invention.

FIG. 2 is a diagram showing one example of a printed circuit board which is the object for processing the load distribution. On the printed circuit board are mounted plural integrated circuits, and the loads of the plural integrated circuits are classified into groups and wired. As shown in FIG. 2, reference numeral 10 stands for a printed circuit board, 11 for an integrated circuit as a driving source for generating a drive signal, 12 to 15 each for an integrated circuit functioning as a load, 21 for an output pin of the integrated circuit 11 for generating the drive signal, 22 to 25 each for an input pin of the integrated circuit of load for entering the drive signal; and 41 and 42 each for a signal transmission line for transmitting the drive signal. The printed circuit board 10 is mounted with the integrated circuits 11-15 at their predetermined positions and the integrated circuits are connected to each other with a wiring on the printed circuit board 10. The wiring of the printed circuit board 10 is to distribute the drive signal, for example, from the output pin 21 of the integrated circuit 11 as a driving source to each of the input pins 22-25 of the integrated circuits 12-15 of loads. In this case, the input pins 22-25 of loads for receiving the drive signal are divided into plural groups and a line is wired continuously with one stroke in the order from the output pin for the drive signal to each of the input pins of loads in every group. As a result, the signal transmission lines 41 and 42 are wired each as a line for transmitting the drive signal from the driving output pin 21. In this embodiment, the drive signal from the output pin 21 is subjected to load driving through two independent signal transmission lines 41, 42 to the input pins 22, 23 and 24, 25, respectively, of loads whose load capacities are equal as high as a value C. In this case, the load input pins 22-25 are divided, for example, into two groups, a first group comprising the input pins 22 and 23 and a second group comprising the input pins 24 and 25, and the wiring is effected from the output pin 21 as a driving source through the signal transmission line in every group, i.e., the output pin 21 is wired to the load input pins 22, 23 through the signal transmission line 41 and to the input pins 24, 25 through the signal transmission line 42, thereby allowing the drive signal to be transmitted to each of the load input pins 22, 23 and 24, 25 through the two signal transmission lines 41, 42, respectively.

In dividing the load input pins into groups and wiring them with one signal transmission line in every group to transmit the drive signal through plural signal transmission lines, the following two electric restraints for the signal transmission line should be satisfied from the viewpoint of a circuit configurartion:

1: To distribute the number of loads to make load capacities of each signal transmission line equal and even; and 2: To equalize distances from the output pin of each signal transmission line to the loads in the same wiring order.

The loads are divided into groups so as to satisfy the above electric restraints and to select the shortest signal propagation delay time below signal propagation delay times tolerable by all the loads and each of the plural signal transmission lines is wired in every group divided in the manner as has been described hereinabove.

In the groups of loads, the following processing is implemented to determine an optimum group:

First, the number of loads is equally grouped so as to allow each of the signal transmission lines to possess an equal load capacity in accordance with the restraint 1 above. Secondly, in order to satisfy the restraint 2 above by equalizing the distances to the loads in the same wiring order from the output pin 21 of each signal transmission line in every group, a group is determined in which a regional distance is maximized in a region from the output pin 21 of each signal transmission line to the first load that is the first place of the wiring order therefrom or a region from the load in the Nth place of the wiring order to the load in the (N+1)th place of the wiring order therefrom. In order to allow a regional distance for all the groups to agree with the group in which the maximum regional distance is given, each of the signal transmission lines is wired in a detour. A so-called "detour wiring" is determined for its wiring distance in every group as an assessment value A in accordance with the following formula (1):

$$A = L + \sum_{G=1}^{\text{Number of Groups}} \cdot \sum_{N=1}^{\text{Number of Loads}} (l_{MAX \cdot N} - l_{GN}) \tag{1}$$

where L is the sum of distances of the signal signal transmission lines when all the groups are wired in the shortest distance;

$l_{MAX \cdot N}$ is a maximum regional distance between the (N−1)th and Nth places of the wiring order in group G; and $l_{GN}$ is a regional distance between the (N−1)th and Nth places of the wiring order in group G.

For each of the groups, the assessment value A is given in accordance with the formula (1) above. If there are plural groups which give the same assessment value A, a group is selected which gives a combination that minimizes an increment distance B by the detour wiring to the shortest length. The increment distance B by the detour wiring is given as follows:

$$B = \sum_{G=1}^{\text{Number of Groups}} \cdot \sum_{N=1}^{\text{Number of Loads}} (l_{MAX \cdot N} - l_{GN}) \quad (2)$$

The maximum signal propagation delay time, $T_{MAX}$, is given by a load capacity in every group and a value corresponding to all the assessment values A of the signal transmission lines by the detour wiring in one group given by the formula (1) above. More specifically, the maximum signal propagation delay time, $T_{MAX}$, can be given from a delay time per unit distance of a wiring material, $T_1$, and a ratio of a delay time to a load capacity, $T_2$, by the following formula (3):

$$T_{MAX} = [\text{Assessment value of formula (1)}]/(\text{number of groups}) \times T_1 + (\text{load capacities of a group in which the load capacities become maximum}) \times T_2 \quad (3)$$

The load distribution of the printed circuit board will now be described more in detail.

FIG. 3a shows one example of the design base data table of the printed circuit board design data which is stored in the external storage unit. The design base data table 31 is a data table for providing a design base data for processing load distribution. The delay time per unit time of a wiring material, $T_1$, the ratio of the delay time to the load capacity, $T_2$, and the tolerance signal propagation delay time, $T_3$ are set as the design base data.

FIG. 3b shows one example of the pin data table of the printed circuit board design data stored in the external storage unit. The pin data table 32 is set so as to correspond to the printed circuit board as an object of processing as shown in FIG. 2.

Figure 4:
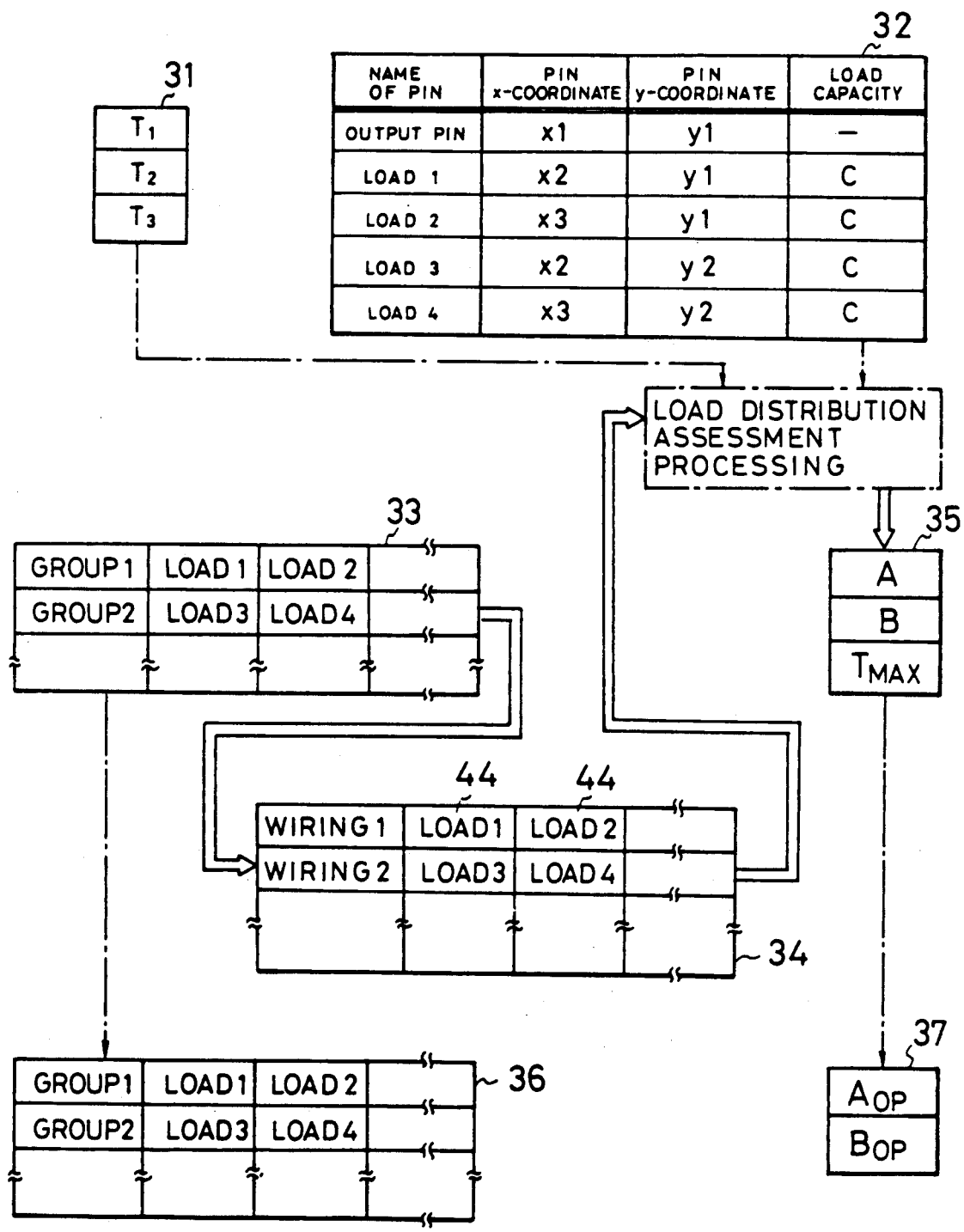
FIG. 4 is an explanation diagram showing a flow of data for assessment processing of load distribution by grouping optimum combinations.

FIG. 4 shows an explanation diagram indicating a flow of data for the assessment processing of the load distribution by optimum grouping. In FIG. 4, reference numeral 31 stands for the design base data table, 32 for the pin data table, 33 for a load distribution combination table, 34 for a wiring order permutation table, 35 for an assessment value data table, 36 for an optimum distribution combination table, and 37 for an optimum assessment value data table.

The pin data table 32 and the design base data table 31 are stored in the data file 5 of the external storage unit 1 and transferred to the main storage unit 7 by the initialization processing of the processing program, thereby starting the processing. The load distribution combination table 33 stores a load indication pointer 44 for indicating each of the loads in the pin data table 32 and serves as a management of the loads belonging to each group. The wiring order permutation table 34 is a table storing a wiring order when the loads are wired in the shortest distance with one stroke in each of the groups of the load distribution combination table 33 and has the same structure as in the load distribution combination table 33. The assessment value data table 35 stores the assessment value A for the distance of the signal transmission line given by the formula (1), the increment distance B of the detour wiring given by the formula (2), and the maximum signal propagation delay time $T_{MAX}$ given by the formula (3).

In a combination of distribution of the loads divided into groups, the processing is executed to determine a combination in which the assessment value A for the distance of the signal transmission line becomes the shortest, the increment distance B of the detour wiring becomes the shortest, and the maximum signal propagation delay time $T_{MAX}$ becomes below the tolerance signal propagation delay time $T_3$. These processings are implemented using the load distribution combination table 33, the wiring order permutation table 34, and the assessment value data table 35. An optimum data in the course of the processing is continued to be processed while the content of the load distribution combination table 33 is temporarily saved in the optimum distribution combination table 36 and the content of the assessment value data table 35 is temporarily saved in the optimum assessment value data table 37.

As a result, among combinations of distribution of the loads processed, a combination of the optimum load distribution in which the assessment value A for the distance of the signal transmission line is the smallest, the increment distance B of the detour wiring is the shortest, and the maximum signal propagation delay time $T_{MAX}$ is below the tolerance signal propagation delay time $T_3$ is given to the optimum distribution combination table 36, and its assessment value is given to the optimum assessment value data table 37. In wiring the loads with the signal transmission line in such a combination of optimum load distribution given as above, the signal propagation delay time of the signal transmission line becomes the smallest.

Figure 5:
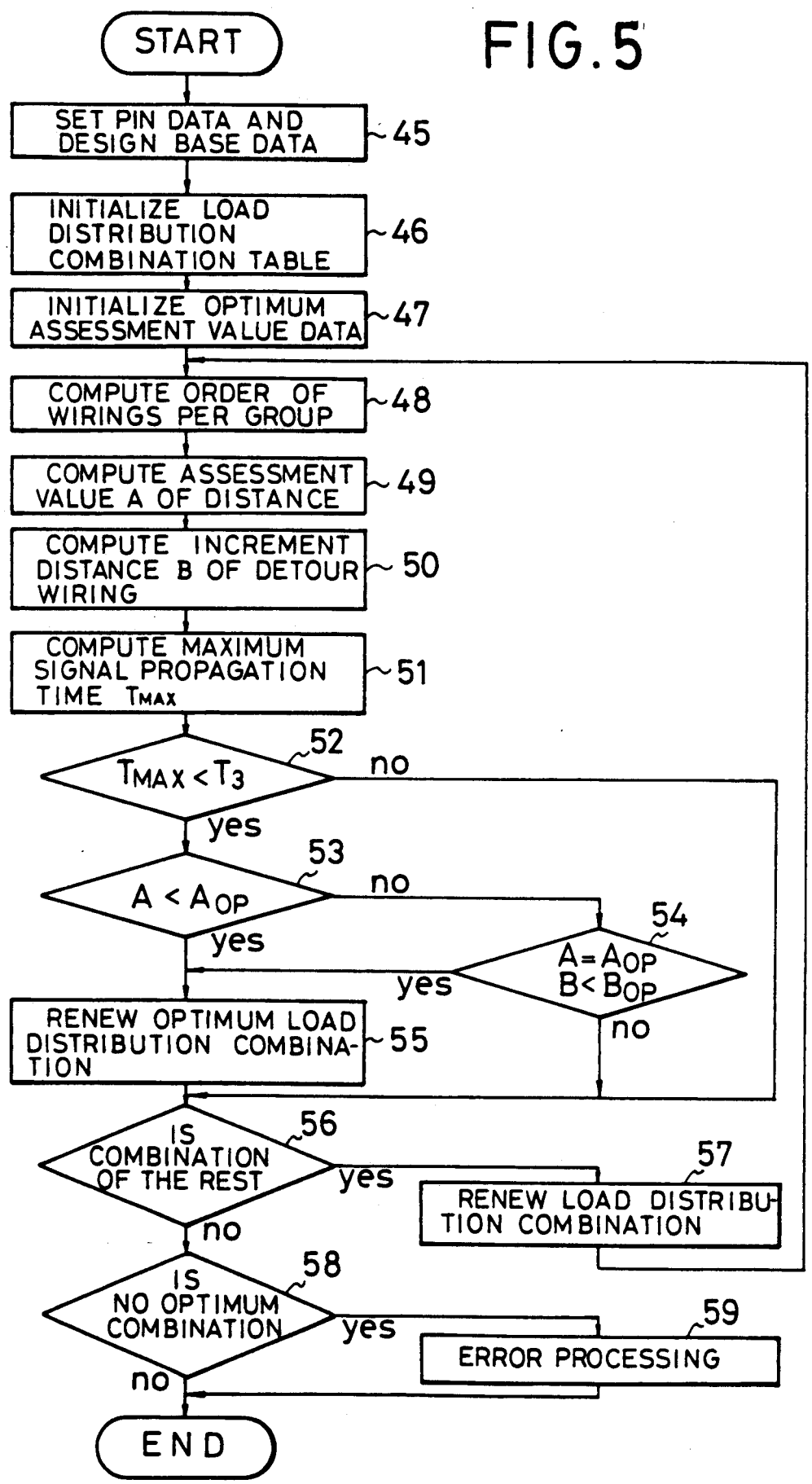
FIG. 5 is a flowchart of processing for determining a combination of optimum load distribution.

FIG. 5 shows a flowchart showing the processing for giving a combination of the optimum load distribution. The processing for the combination of the optimum load distribution will be described hereinbelow in accordance with FIG. 5 with reference to a flow of data as shown in FIG. 4.

In step 45, the pin data is set as the pin data table 32 to the main storage unit 5 from the external storage unit 1 and the design base data is likewise set as the design base data table 31 to the main storage unit 5 from the external storage unit 1. Then, at step 46, an initial value of the load distribution combination table 33 is set, and data on groupings is set as group 1 which corresponds to the first half of the loads set in the pin data table 32 as an initial value and as group 2 which corresponds to the last half of the loads. The flow then proceeds to step 47 where the optimum assessment value data table 37 is initialized. In other words, the maximum value (the worst assessment value) is set in the optimum assessment value data table 37. This concludes the initialization processing and the flow proceeds to step 48 where the determination processing for a combination of optimum load distribution starts. At step 48, the wiring order is computed in every group. In other words, the wiring order of wiring the loads in each group is determined and the processing is implemented for storing load indication pointers 44 for indicating pins of the loads in a sequence in the wiring order permutation table 34 in accordance with the order of wiring. Then at step 49, the assessment value A for the distance of the signal transmission line is computed by the formula (1) and is stored in the assessment value data table 35. The flow proceeds to step 50 where the increment distance B of the detour wiring is computed in accordance with the formula (2) and stored in the assessment value data table 35. Thereafter, at step 51, the maximum signal propagation delay time $T_{MAX}$ is computed in accordance with the formula (3) and stored in the assessment value data table 35.

In the determination processing at step 52, it is determined whether or not the maximum signal propagation delay time $T_{MAX}$ computed at step 51 is equal to or below the tolerance signal propagation delay time $T_3$. If it is determined at step 52 that the maximum signal propagation delay time $T_{MAX}$ is equal to or below the tolerence signal propagation delay time $T_3$, the flow proceeds to step 53 where it is further determined whether or not the assessment value A stored in the assessment value data table 35 is equal to or below an optimum assessment value $A_{OP}$, that is, the optimum value of the assessment values A stored in the optimum assessment data table 37. If it is determined at step 52 that the assessment value A is equal to or below the optimum assessment value $A_{OP}$, then the flow proceeds to step 55 where an updating processing is implemented for updating a combination of optimum load distribution. In order to update the combination of the optimum load distribution, the content of the load distribution combination table 33 is saved in the optimum combination table 36 and the content of the assessment value data table 35 is saved in the optimum assessment value data table 37.

If it is determined at step 53 that the assessment value A is not equal to or below the optimum assessment value $A_{OP}$, the flow proceeds to step 54 for judgment processing. In the determination processing at step 54, if it is determined that the assessment value A stored in the assessment value data table 35 is equal to the optimum assessment value $A_{OP}$ stored in the optimum assessment value data table 37 and, furthermore, the increment distance B of the detour wiring stored in the assessment value data table 35 is shorter than an increment distance $B_{OP}$ of the optimum values stored in the optimum assessment value data table 37, the flow proceeds to step 55 where the processing is implemented for updating the combination of optimum load distribution. In the other cases or at step 52 where the maximum signal propagation delay time $T_{MAX}$ is not equal to or below the tolerance signal propagation delay time $T_3$, no processing for updating the combination of optimum load distribution is implemented.

After a combination of groups of loads has been assessed by the processing at steps 48 to 55, the flow proceeds to step 56 where it is determined whether or not a combination of the rest in the groups of the loads is still left unprocessed. If it is determined at step 57 that there is left another combination of load distribution in accordance with the grouping conditions as have been described hereinabove, the processing is implemented at step 57 for updating the combination of load distribution is updated and the load distribution combination table 33 is updated. Then the flow is returned to step 48 from which an assessment of the updated combination of load distribution starts. The processing from steps 48 to 57 is repeated to finish the assessment of all the combinations of load distribution. This is judged at step 56 and the flow proceeds to step 58. At this time, the combination of the optimum load distribution is stored in the optimum combination table 36 and its assessment value is stored in the optimum assessment value data table 37.

At step 58, it is determined whether or not the combination of the optimum load distribution is present with reference to the optimum combination table 36 and the optimum assessment value data table 37. If it is determined at step 58 that no combination of the optimum load distribution is present, for example, if there is no combination of load distribution in which it becomes below the tolerance signal propagation delay time $T_3$, the flow proceeds to step 59 where the error processing is implemented and the processing ends.

Figure 6A:
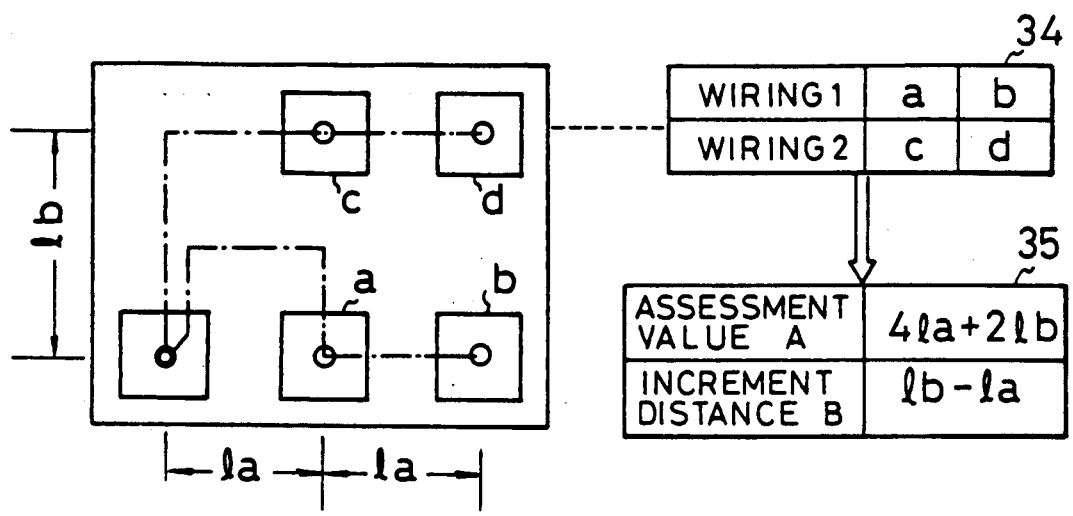
FIGS. 6a, 6b and 6c are each an explanation diagram for explaining processing examples obtained by the assessment processing of combinations of load distribution of the printed circuit board of FIG. 2.
Figure 6B:
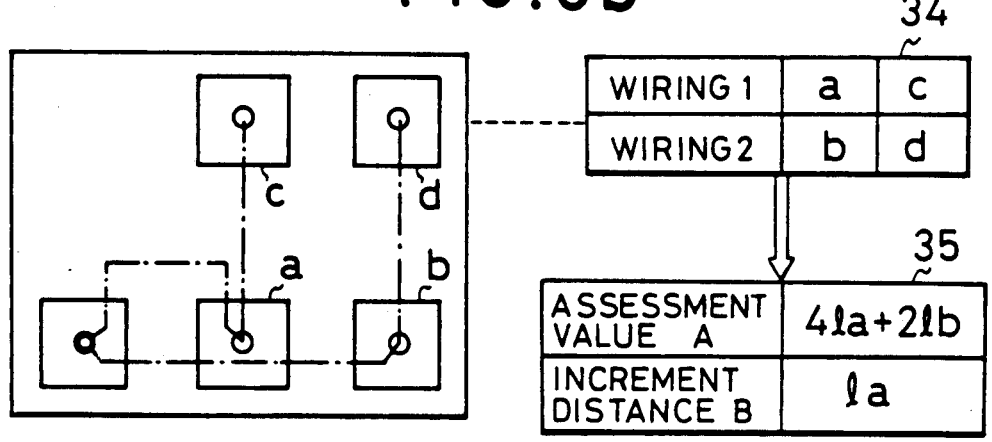
Figure 6C:
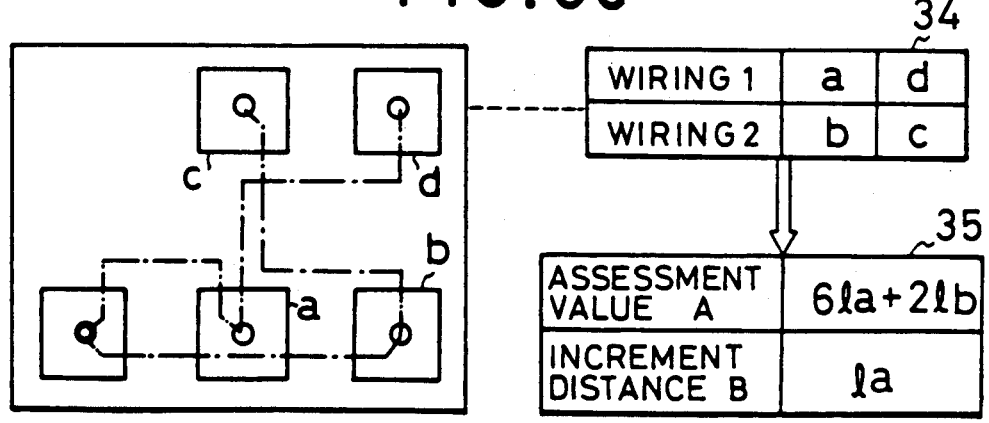

FIGS. 6a, 6b and 6c show assessment values obtained when the assessment processing is implemented on different combinations of load distribution for plural loads on the printed circuit board as shown in FIG. 2. On the printed circuit board in FIG. 2, $l_b > l_a$ from the positional relationship of the integrated circuits mounted thereon so that the combination of load distribution as shown in FIG. 6b is considered to be the combination of the optimum load distribution as is apparent from the assessment values in the optimum assessment value data file 35 as shown in the drawing. It is to be noted herein that FIGS. 6a, 6b and 6c show the case in which two signal transmission lines are wired, however, in the case where three or more signal transmission lines are wired, the combination of load distribution may be set and updated likewise by dividing the corresponding loads into groups and subjecting the combination of the grouped loads to the assessment processing.

Another example of assessment processing for a combination of load groupings will now be described. In this case, the combination of loads grouped is subjected to assessment processing in the manner as have been described hereinabove by changing the number of signal transmission lines for distributing the drive signal.

FIGS. 7-10 are each an explanation view for explaining other examples of assessment processing on the combination of groups of loads.

In the assessment processing of the combination of load distribution on the printed circuit board shown in FIG. 2, the number of the signal transmission lines is set at a constant number to be determined on a driving current of the output pin. In other processing examples, the driving current from the driving output pin is variable so that the number of the signal transmission lines may be selected up to an upper limit value to be determined by the maximum driving current of the output pin. In the assessment processing, the number of the signal transmission lines is increased from one to the upper limit value and the result of the assessment of load distribution is given in substantially the same manner as in the processing example as shown in FIG. 2. If the result of the above assessment of the optimum load distribution is given, the number of the signal transmission lines in this case is determined as a number of the optimum signal transmission lines and the result of the assessment of load distribution at that time is determined as an optimum load distribution result. In order to agree with these, then the driving current of the output pin of the integrated circuit is switched and the signal transmission line on the printed circuit board is determined. This forms an optimum signal transmission line system for the driving signal.

These processing examples will be described hereinbelow with reference to FIGS. 7 to 10.

Figure 7:
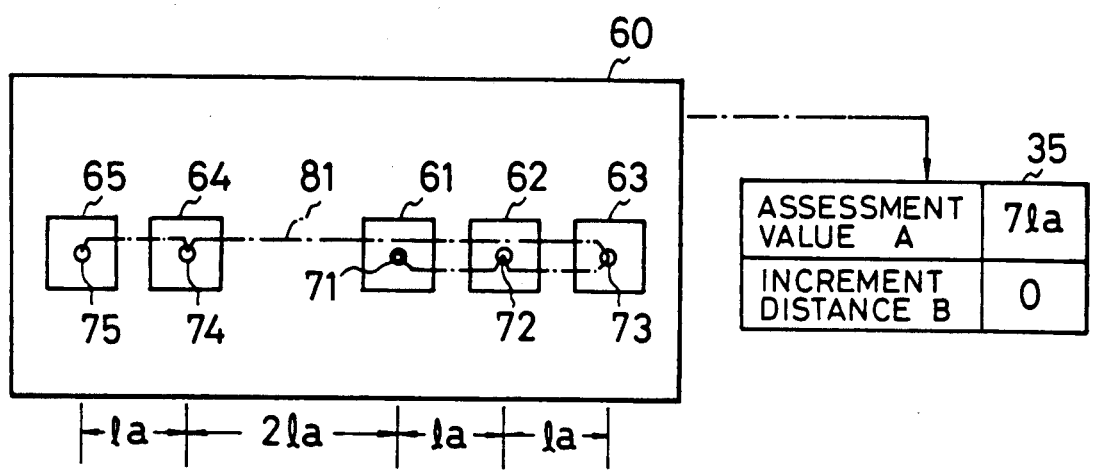
FIGS. 7, 8, 9 and 10 are each an explanation diagram for explaining other processing examples obtained by the assessment processing of combinations of load distribution.

As shown in FIG. 7, reference numeral 60 stands for a printed circuit board, 61 for an integrated circuit for a source of driving, as well as 62, 63, 64 and 65 each for an integrated circuit functioning as a load. These integrated circuits 62, 63, 64, 65 are mounted at given positions on the printed circuit board 60. An output pin 71 of the integrated circuit 61 functioning as a driving source is drivable by four of the independent signal transmission lines at the maximum, and the integrated circuits 62, 63, 64 and 65 each have an identical load capacity C.

The load distribution as shown in FIG. 7 is designed so as to wire the driving output pin 71 to input pins 72, 73, 74, 75 of integrated circuits 62, 63, 64, 65 functioning as loads with one signal transmission line in the shortest distance. As the maximum signal propagation delay time is a signal propagation delay time at the input pin 75 of load, it is arranged to become equal to or below the tolerance signal propagation delay time and the assessment value at this time is determined such that the assessment value A for the distance of the signal transmission line is $7l_a$ and the increment distance B of the detour wiring is 0.

Figure 8:
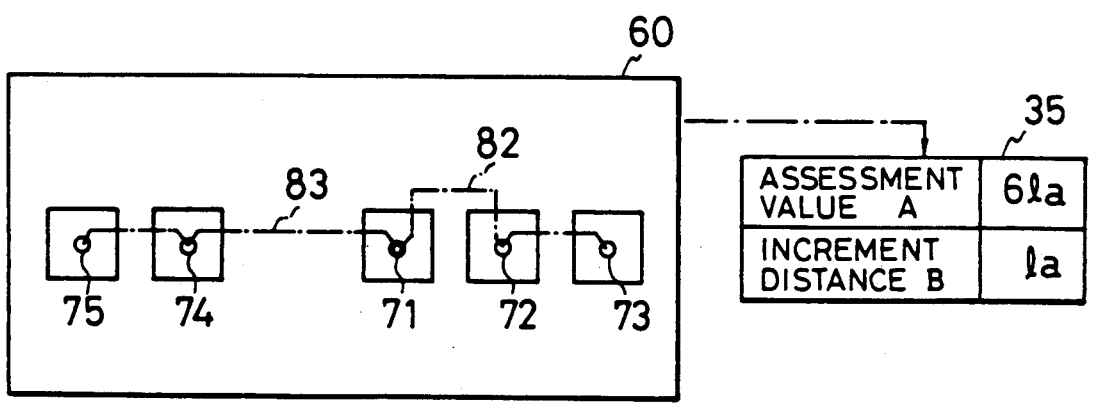

The load distribution as shown in FIG. 8 is designed so as to wire the driving output pin 71 to the input pins with two independent signal transmission lines 82, 83 by processing the determination of a combination of the optimum load distribution in substantially the same manner as with the assessment processing in FIG. 2. In this case, the loads are divided into two groups, one group containing the input pins 72, 73 and the other containing the input pins 74, 75 and by wiring the shortest distances between the corresponding input pins with the respective signal transmission lines 82, 83. In this case, the maximum signal propagation delay time generates at the input pin 75 of load. It is noted that the maximum signal propagation delay time of the input pin 75 is shorter than the maximum signal propagation delay time of the signal transmission line shown in FIG. 7 so that it is apparent that it is equal to or below the tolerance signal propagation delay time. The assessment value at this time is such that an assessment value A for the distance of the signal transmission lines including the detour wiring is $6l_a$ and its increment distance B of the detour wiring is $l_a$. This is a better result than in the case of one signal transmission line.

Figure 9:
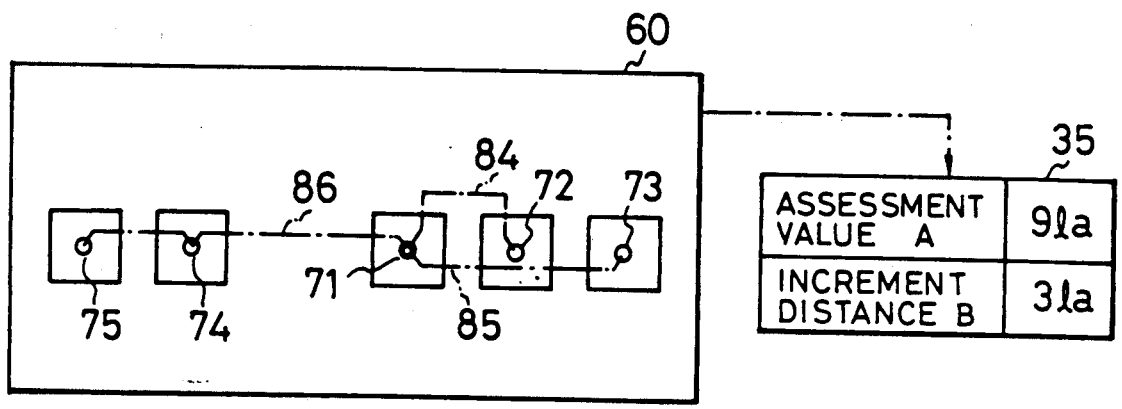

In the load distribution as shown in FIG. 9, the driving pin 71 is wired with three independent signal transmission lines 84, 85, 86 for distributing loads. The maximum signal propagation delay time as the load distribution result in this case generates at the input pin 75 of load in the same manner as in FIG. 8. The assessment value A of the distance of the signal transmission lines including the detour wiring is $9l_a$ and the increment distance B of the detour wiring is $3l_a$. These assessment values are larger than the case in FIG. 8 so that the load distribution result in the case of two signal transmission lines in FIG. 8 remains as an optimum distribution result in this case.

Figure 10:
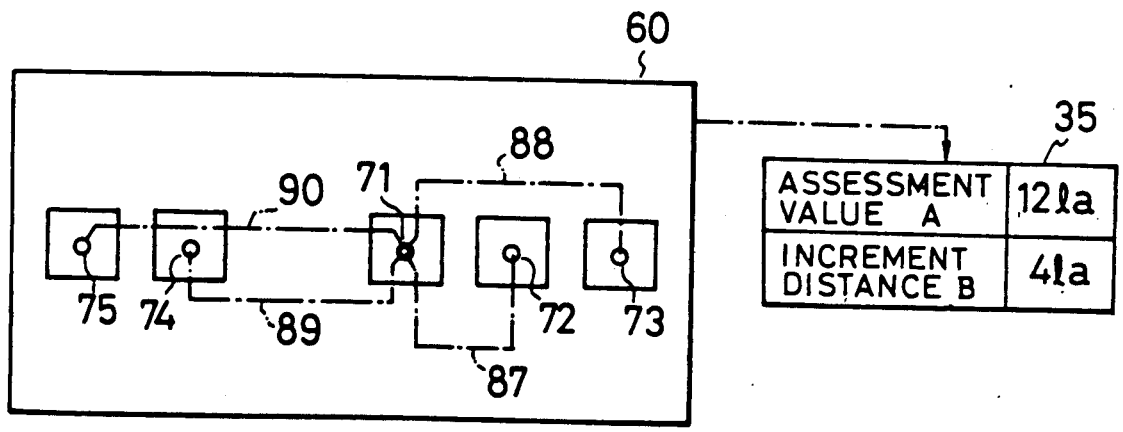

In the case of load distribution as shown in FIG. 10, an example is shown in which the wiring for distributing loads from the driving output pin 71 is effected using four independent signal transmission lines 87, 88, 89, 90. The maximum signal propagation delay time in this case generates at input pins 72, 73, 74, 75 of loads, respectively, and it is equal to or below the maximum signal propagation delay time generated at the input pin 75 of load as in the case in FIG. 8. For the assessment values, the value A of distances of the signal transmission lines including a detour is $12l_a$ and the increment distance B of the detour wiring is $4l_a$. In this case, no optimum distribution result can be given.

The above description on load distribution is directed to cases where the signal transmission line is changed from 1 to 4. It is accordingly to be noted that, in assessment by means of distances of all signal transmission lines including an increment distance by a detour wiring, an optimum load distribution result is given when the number of the signal transmission lines is two and the optimum distribution result leads to a wiring diagram as shown in FIG. 8.

It is to be noted that, in order to facilitate an understanding in the above description on the embodiments according to the present invention, all loads are set to be equal in load capacity and the number of loads to be connected to each of the signal transmission lines is equally grouped so as to allow each group to provide an equal load capacity. Thus an assessment by distances of the signal transmission lines is equivalent to an assessment by a signal propagation delay time. In the case where a load capacity of each load is not equivalent to each other, however, an assessment by means of a distance of a signal transmission line is made on the design basis of an assessment by means of an original signal propagation delay time, thus producing a result of load distribution in which the signal propagation delay time becomes the shortest. It is also to be noted that, in assessing a result of load distribution by changing the number of signal transmission lines, the number of the signal transmission lines is increased from one to the upper limit value and this operation concludes when a load distribution result is determined which gives a combination of the group of loads in which the maximum signal propagation delay time is equal to or below the tolerance signal propagation delay time.

It is understood that the present invention has been described by way of examples, but the invention is not restricted to the examples and encompasses various modifications within its scope without departing the spirit of the invention.

As has been described hereinabove, the present invention permits a load distribution so as to satisfy an electric restraint and make a signal propagation delay time the shortest in carrying out the load distribution for supplying a drive signal from one output pin to plural loads using a plurality of independent signal transmission lines mounted on a printed circuit board, thus wiring the printed circuit board with a high efficiency in signal transmission of a drive signal. In carrying out a mounting design by the optimum load distribution, it is possible to produce a limit upon a signal propagation delay time and, as a result, to find a signal transmission line exceeding its limit, so that a return to a logic design can be prevented in advance and saving a considerable number of steps for formation of printed circuit boards can be saved.

What is claimed is:

1. A load distribution method in which loads are divided into groups and each of plural input pins of integrated circuits of a load is wired continuously with one stroke of a signal transmission line in an order from a driving output pin in each group when wiring for distributing a drive signal from a driving output pin of an integrated circuit to plural input pins of integrated circuits, functioning as loads, which are mounted at given positions on a printed circuit board, the load distribution method comprising:

dividing the loads into groups by equally distributing a number of the loads so as to allow a load capacity to be equal on each of plural signal transmission lines;

computing a signal propagation delay time of a signal transmission line wired in an equal distance to a load which is equal in a wiring order from the driving output pin in each group; and grouping the loads by determining a combination of loads in which the signal propagation delay time of the signal transmission line becomes the shortest.

2. A method of wiring plural integrated circuits on a printed circuit board by dividing the plural integrated circuits functioning as loads and wiring between the plural integrated circuits mounted at given positions on the printed circuit board using a load distribution method as claimed in claim 1.

3. A wiring method for integrated circuits on a printed circuit board by mounting loads of plural integrated circuits at given positions on the printed circuit board and wiring plural signal transmission lines for supplying a drive signal from a driving output pin of an integrated circuit through the plural signal transmission lines to the loads of the plural integrated circuits mounted at the given positions on the printed circuit board, said wiring method comprising the steps of:

dividing the loads into groups by equally distributing the number of the loads so as to equalize a load capacity of each of the plural signal transmission lines;

determining a combination of loads in which a signal propagation delay time of a signal transmission line becomes the shortest by computing the signal propagation delay time of the signal transmission line wired in an equal distance to the load equal in a wiring order from the driving output pin in each group in combinations of the loads and carrying out a computation of the signal propagation delay time of the signal transmission line in each group by changing a combination of the loads in each group; and dividing into groups the loads in the combination of the loads in which the signal propagation delay time of the signal transmission line is determined to be the shortest and wiring the plural loads divided into for supplying the drive output to the loads through each of a plurality of independent signal transmission lines.

4. A computer system for executing operation processing of a load distribution method as claimed in claim 1, comprising:

an external storage unit for storing a printed circuit board design data including a pin data table and design base data table of an integrated circuit; and a computer main frame installed with a control unit, a main storage unit, and a central processing unit, in which a signal propagation delay time of a signal transmission line is computed using the printed circuit board design data from the external storage unit when the printed circuit board is wired, and a combination of loads is determined so as to provide the shortest signal propagation delay time.

5. A computer system as claimed in claim 4, wherein:

said design base data table contains data of each of a delay time per unit time of a wiring material, a ratio of the delay time to a load capacity, and a tolerance signal propagation delay time; and said pin data table contains data of each of a name of pin, a pin coordinate, and a load capacity of a pin.

6. A load distribution method in which a plurality of signal input load pins of integrated circuits which are mounted at given positions on a printed circuit board are divided into groups and wired serially with each group in an order from a driving output pin of an integrated circuit when a wiring for distributing a drive signal from the driving output pin to the plurality of signal input load pins is carried out, the load distribution method comprising the steps of:

(a) dividing the signal input load pins into groups by distributing the signal input load pins into groups which each contain an equal number of the signal input load pins so that the same load capacitance is found on each of a plurality of signal transmission lines respectively corresponding to the groups;

(b) computing a signal propagation delay time of at least one of said signal transmission lines which is wired from the driving output pin to one of the groups of signal input load pins, each of the signal input load pins being arranged in a wiring order from the driving output pin within each group such that the distances within each group between the signal input load pins which occupy corresponding positions in the wiring order of each of the groups are the same from group to group;

(c) determining the wiring order which results in the propagation delay time being the shortest along with the shortest propagation delay time itself;

(d) carrying out steps (b) and (c) by changing a combination of the signal input load pins between the groups; and (e) grouping the signal input load pins by determining, among combinations of the signal input load pins, a combination of signal input load pins in which the signal propagation delay time of said at least one signal transmission line is the shortest.

7. A method of wiring plural integrated circuits on a printed circuit board by dividing the plural integrated circuits and wiring between the plural integrated circuits mounted at given positions on the printed circuit board using a load distribution method as claimed in claim 6.

8. A computer system for executing operation processing of a load distribution method as claimed in claim 6, comprising:

an external storage unit for storing a printed circuit board design data including a pin data table and a design base data table of an integrated circuit; and a computer main frame installed with a control unit, a main storage unit, and central processing unit, in which a signal propagation delay time of a signal transmission line is computed using the printed circuit board design data from the external storage unit when the printed circuit board is wired, and a combination of loads is determined so as to provide the shortest signal propagation delay time.

9. A wiring method for wiring integrated circuits on a printed circuit board by mounting loads of a plurality of integrated circuits at given positions on the printed circuit board and wiring a plurality of signal transmission lines for supplying a drive signal from a driving output pin of an integrated circuit through the plurality of transmission lines to the signal input load pins of the plurality of integrated circuits mounted at the given positions on the printed circuit board, said wiring method comprising the steps of:

dividing the signal input load pins into groups by distributing the signal input load pins into groups which each contain an equal number of the signal input load pins so that the same load capacitance is found on each of the plurality of transmission lines;

computing a signal propagation delay time of at least one of said signal transmission lines which is wired from the driving output pin to one of the groups of signal input load pins, each of the signal input load pins being arranged in a wiring order from the driving output pin within each group such that the distances within each group between the signal input load pins which occupies corresponding positions in the wiring order of each of the groups are the same from group to group;

determining the wiring order which results in the propagation delay time being the shortest along with the shortest propagation delay time itself;

carrying out a computation of the signal propagation delay time of said at least one signal transmission line in each group by changing a combination of the signal input load pins between the groups, and determining, among all combinations of the signal input load pins, a combination of signal input load pins in which the signal propagation delay time of said at least one transmission line becomes the shortest; and wiring the signal input load pins divided into groups in the combination of the signal input load pins in which the signal propagation delay time of said at least one transmission line is determined to be the shortest for supplying the drive signal to the signal input load pins through each of a plurality of independent signal transmission lines.

10. A computer system as claimed in claim 8, wherein:

said design base data table contains data of each of a delay time per unit time of a wiring material, a ratio of the delay time to a load capacitance, and a tolerance signal propagation delay time; and said pin data table contains data of each of a name of pin, a pin coordinate, and a load capacitance of a pin.

* * * * *